United States Patent
Hioka et al.

(10) Patent No.: US 9,841,471 B2
(45) Date of Patent: Dec. 12, 2017

(54) HALL ELEMENT

(71) Applicant: SEIKO INSTRUMENTS INC., Chiba-shi, Chiba (JP)

(72) Inventors: Takaaki Hioka, Chiba (JP); Mika Ebihara, Chiba (JP)

(73) Assignee: SII Semiconductor Corporation (JP)

( * ) Notice: Subject to any disclaimer, the term of this patent is extended or adjusted under 35 U.S.C. 154(b) by 16 days.

(21) Appl. No.: 14/997,710

(22) Filed: Jan. 18, 2016

(65) Prior Publication Data
US 2016/0209480 A1    Jul. 21, 2016

(30) Foreign Application Priority Data
Jan. 20, 2015 (JP) ................. 2015-008885

(51) Int. Cl.
*G01R 33/07* (2006.01)

(52) U.S. Cl.
CPC ......... *G01R 33/077* (2013.01); *G01R 33/075* (2013.01)

(58) Field of Classification Search
CPC combination set(s) only.
See application file for complete search history.

(56) References Cited

U.S. PATENT DOCUMENTS

2007/0290682 A1*  12/2007  Oohira ............... G01R 33/07
                                                      324/251
2011/0031960 A1*  2/2011   Hohe ............... G01R 33/0017
                                                      324/202

* cited by examiner

*Primary Examiner* — Clayton E Laballe
*Assistant Examiner* — Jas Sanghera
(74) *Attorney, Agent, or Firm* — Klintworth & Rozenblat IP LLP; Bruce L. Adams, Esq.

(57) ABSTRACT

A Hall element is integrated on a single substrate and is capable of cancelling offset voltage with a spinning switch configured to switch spinning current and capable of simultaneously detecting a horizontal direction magnetic field and a vertical direction magnetic field. The Hall element has a four-fold rotational axis and includes a P-type semiconductor substrate layer formed of P-type silicon, a vertical magnetic field detection N-type doped region formed on the P-type semiconductor substrate layer, and eight horizontal magnetic field detection N-type doped regions formed so as to surround the vertical magnetic field detection N-type doped region.

11 Claims, 5 Drawing Sheets

HALL ELEMENT

BACKGROUND OF THE INVENTION

1. Field of the Invention

The present invention relates to a semiconductor Hall element, and more particularly, to a Hall element capable of detecting magnetic fields in vertical and horizontal directions and removing offset voltage.

2. Description of the Related Art

A Hall element enables non-contact position detection and angle detection, and is thus used as a magnetic sensor.

First, the principle of magnetic detection by a Hall element is described. When a magnetic field is applied vertically to a current flowing through a substance, an electric field (Hall voltage) is generated in a direction vertical to both the current and the magnetic field.

FIG. 5 is a diagram for illustrating the principle of an ideal Hall effect. On an ideal Hall element, a Hall voltage VH output from a voltmeter 3 is represented as:

$$VH=\mu B(W/L)Vdd$$

where W and L represent respectively a width and a length of a Hall element magnetism sensing portion 1, $\mu$ represents electron mobility, Vdd represents a voltage applied by a power supply 2 for supplying a current, and B represents an applied magnetic field. A coefficient proportional to the applied magnetic field B corresponds to the magnetic sensitivity, and hence a magnetic sensitivity Kh of this Hall element is represented as:

$$Kh=\mu(W/L)Vdd$$

As such a Hall element, there have been known a horizontal Hall element configured to detect a magnetic field component vertical to a substrate (wafer) surface and a vertical Hall element configured to detect a magnetic field component horizontal to the substrate surface.

When both of a vertical direction magnetic field and a horizontal direction magnetic field are to be detected, in many cases, the horizontal Hall element and the vertical Hall element are separately formed on the same substrate (wafer) to realize the detection.

On the other hand, in an actual Hall element, an output voltage is generated even when no magnetic field is applied. The voltage output under a magnetic field of zero is called offset voltage. It is considered that the offset voltage is generated when potential distribution inside the element becomes imbalanced by, for example, mechanical stress applied to the element from the outside or misalignment occurring in a manufacturing process. For an actual application, compensation is necessary for the offset voltage so that the offset voltage may be considered to be 0.

Taking a case of a horizontal Hall element as an example, a method of compensating for offset voltage is described.

FIG. 6 is a circuit diagram for illustrating the principle of an offset cancellation circuit utilizing spinning current. A Hall element 10 has a symmetrical shape and includes four terminals T1, T2, T3, and T4 so that a control current is caused to flow between one pair of input terminals and an output voltage is obtained between the other pair of output terminals. When one pair of the terminals T1 and T2 of the Hall element serve as control current input terminals, the other pair of the terminals T3 and T4 serve as Hall voltage output terminals. In this case, when a voltage Vin is applied to the input terminals, an output voltage Vh+Vos is generated between the output terminals, where Vh represents a Hall voltage proportional to a magnetic field of the Hall element and Vos represents an offset voltage. Next, with the terminals T3 and T4 serving as the control current input terminals and the terminals T1 and T2 serving as the Hall voltage output terminals, the input voltage Vin is applied between the terminals T3 and T4 to generate a voltage −Vh+Vos between the output terminals. Reference symbols S1 to S4 denote sensor terminal switching means, and one of terminals N1 and N2 is chosen by a switching signal generator 11.

By subtracting one output voltage from the other which are obtained by the currents flowing in two directions described above, the offset voltage Vos may be cancelled to obtain an output voltage 2Vh proportional to the magnetic field (see, for example, Japanese Patent Application Laid-open No. Hei 06-186103).

Further, offset voltage can be removed by causing current to flow in two directions or more for an offset voltage of a vertical Hall element, or calculating outputs of a plurality of Hall elements (for example, see Japanese Patent Application Laid-open No. 2007-212435).

In order to detect a vertical magnetic field component (Z direction) and horizontal magnetic field components (X and Y directions) on a substrate (wafer) surface, it is necessary to form a horizontal Hall element and a vertical Hall element on the same substrate, which leads to an increase in chip size. Further, a vertical magnetic field and a horizontal magnetic field are detected by separate Hall elements, and hence the magnetic fields are measured at the centers of the respective Hall elements. Thus, the magnetic field components are detected at different positions and accuracy is lost. In addition, in order to compensate for an offset voltage of the vertical Hall element configured to detect a horizontal magnetic field, it is necessary to arrange a plurality of vertical Hall elements, which leads to drawbacks such as a further increase in chip size and a higher cost.

SUMMARY OF THE INVENTION

It is an object of the present invention to provide an integrated Hall element capable of cancelling offset voltage with a spinning switch configured to switch spinning current and simultaneously detecting a horizontal direction magnetic field and a vertical direction magnetic field.

In order to solve the above-mentioned problems, one embodiment of the present invention employs the following structure.

First, according to one embodiment of the present invention, there is provided a Hall element configured to detect a vertical magnetic field and a horizontal magnetic field by utilizing a Hall effect, to thereby reduce offset voltage, the Hall element including: a P-type semiconductor substrate layer formed of P-type silicon; a vertical magnetic field detection N-type doped region formed on the P-type semiconductor substrate layer; and eight horizontal magnetic field detection N-type doped regions formed so as to surround the vertical magnetic field detection N-type doped region.

Further, in the Hall element, the vertical magnetic field detection N-type doped region includes: a vertical magnetic field sensing portion having a four-fold rotational axis and one of a square shape and a cross shape; and, at respective vertices and end portions thereof, vertical magnetic field detection control current input terminals and vertical magnetic field Hall voltage output terminals corresponding to surface N-type highly-doped regions having the same shape.

Further, in the Hall element, the eight horizontal magnetic field detection N-type doped regions include: four horizontal magnetic field detection N-type doped regions that are formed on right and left sides of the vertical magnetic field detection N-type doped region (X direction), and are configured to detect an X direction component of horizontal magnetic field components; and four horizontal magnetic field detection N-type doped regions that are formed on upper and lower sides of the vertical magnetic field detection N-type doped region (Y direction), and are configured to detect a Y direction component of the horizontal magnetic field components.

Further, in the Hall element, all of the eight horizontal magnetic field detection N-type doped regions have the same shape. The Hall element further includes, for each of the surface N-type highly-doped regions having the same shape formed at the respective vertices and end portions of the vertical magnetic field detection N-type doped region: horizontal direction magnetic field detection control current input terminals corresponding to the surface N-type highly-doped regions formed on a right and left (X) direction axis and an up and down (Y) direction axis of the Hall element; a buried N-type highly-doped region formed in a lower part of the control current input terminal corresponding to the surface N-type highly-doped region in a substrate direction (Z direction); and horizontal magnetic field Hall voltage output terminals corresponding to two surface N-type highly-doped regions formed across a horizontal magnetic field sensing portion and the control current input terminal corresponding to the N-type highly-doped region in the up and down (Y) direction and the right and left (X) direction, the horizontal magnetic field sensing portion being sandwiched between the control current input terminal corresponding to the surface N-type highly-doped region and the buried N-type highly-doped region.

Further, in the Hall element, a vertical magnetic field detection surface N-type highly-doped region functions also as a horizontal magnetic field detection control current input terminal.

Further, in the Hall element, the vertical magnetic field detection surface N-type highly-doped regions serving as the vertical magnetic field detection control current input terminal and the horizontal magnetic field Hall voltage output terminal are formed deep, the horizontal magnetic field detection surface N-type highly-doped region serving as the horizontal magnetic field detection control current input terminal is formed shallow, and the surface N-type highly-doped region serving as the horizontal magnetic field Hall voltage output terminal is formed deeper than the surface N-type highly-doped region serving as the horizontal magnetic field detection control current input terminal.

With the above-mentioned configuration, a magnetic field component vertical to the substrate (wafer) surface and a magnetic field component horizontal to the substrate surface may be simultaneously detected, and offset voltage may be removed with spinning current and the like. Further, instead of a horizontal Hall element for detecting vertical magnetic fields and a vertical Hall element for detecting horizontal magnetic field components that are separately arranged, an integrated Hall element may detect both of the magnetic fields and remove offset voltage.

Consequently, reductions in chip side and cost may be realized.

DETAILED DESCRIPTION OF THE INVENTION

Now, modes for carrying out the present invention are described in detail with reference to the drawings.

Figure 1:
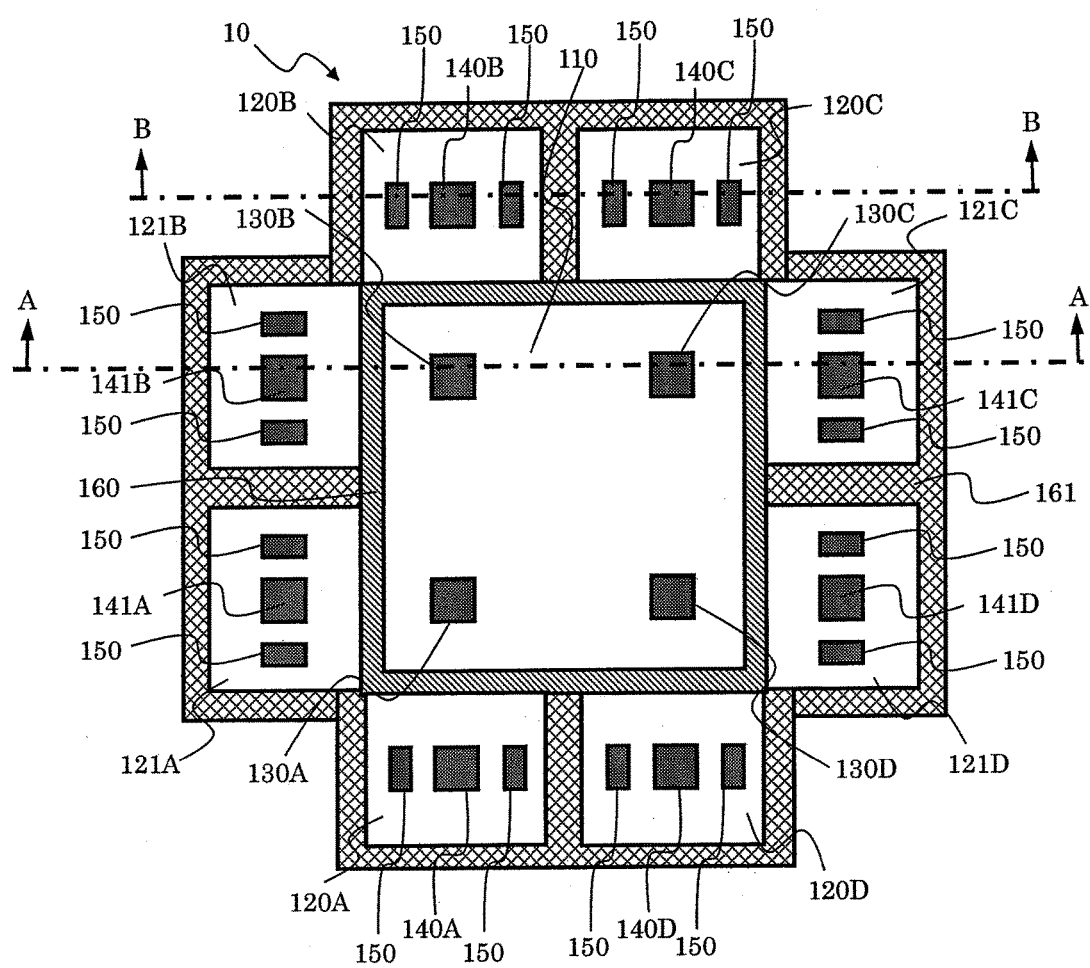
FIG. 1 is a plan view of a Hall element according to one embodiment of the present invention.
Figure 2:
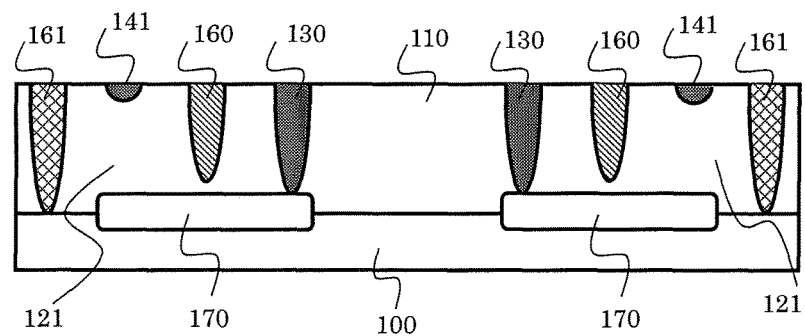
FIG. 2 is a vertical structure diagram taken along the line A-A of FIG. 1 according to the present invention.
Figure 3:
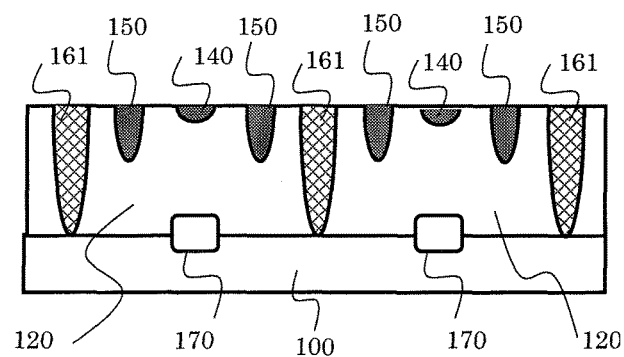
FIG. 3 is a vertical structure diagram taken along the line B-B of FIG. 1 according to the present invention.

FIG. 1 is a plan view of a Hall element according to one embodiment of the present invention. FIG. 2 is a vertical cross-sectional structure diagram of the Hall element according to the embodiment of the present invention taken along the line A-A of FIG. 1. FIG. 3 is a vertical cross-sectional structure diagram of the Hall element according to the embodiment of the present invention taken along the line B-B of FIG. 1.

First, a shape of the Hall element is described.

As illustrated in FIG. 1 to FIG. 3, a Hall element 10 includes, on a P-type semiconductor substrate layer 100, a vertical magnetic field detection N-type doped region 110 and eight horizontal magnetic field detection N-type doped regions 120A to 120D and 121A to 121D which are configured to detect vertical magnetic field components to a square substrate (wafer) surface, the horizontal magnetic field detection N-type doped regions 120A to 120D and 121A to 121D being formed so as to surround the vertical magnetic field detection N-type doped region 110.

The vertical magnetic field detection N-type doped region 110 includes a square vertical magnetic field sensing portion, and surface N-type highly-doped regions 130A, 130B, 130C, and 130D having the same shape, which are formed at respective vertices of the square vertical magnetic field sensing portion and serve as vertical magnetic field detection control current input terminals and vertical magnetic field Hall voltage output terminals. In FIG. 1, there are four surface N-type highly-doped regions. The vertical magnetic field detection N-type doped region 110 in the above-mentioned mode is symmetric with a four-fold rotational axis.

Meanwhile, all of the eight horizontal magnetic field detection N-type doped regions 120A to 120D and 121A to 121D have the same shape. The Hall element includes, for the surface N-type highly-doped regions 130A, 130B, 130C, and 130D having the same shape formed at the respective vertices of the vertical magnetic field detection N-type doped region 110: horizontal direction (X direction) magnetic field detection control current input terminals corresponding to surface N-type highly-doped regions 141A, 141B, 141C, and 141D formed on a right and left (X) direction axis; horizontal direction (Y direction) magnetic field detection control current input terminals corresponding to surface N-type highly-doped regions 140A, 140B, 140C, and 140D formed on an up and down (Y) direction axis; buried N-type highly-doped regions 170 formed in the substrate, that is, in lower parts of the surface N-type highly-doped regions 140A to 140D and 141A to 141D in a substrate direction (Z direction) (see FIG. 2 and FIG. 3); and horizontal magnetic field Hall voltage output terminals corresponding to two surface N-type highly-doped regions 150 formed across a horizontal magnetic field sensing portion and the control current input terminals corresponding to the N-type highly-doped regions 140A to 140D and 141A to 141D in the up and down (Y) direction or the right and left (X) direction, the horizontal magnetic field sensing portion being sandwiched between the control current input terminals corresponding to the surface N-type highly-doped regions 140A to 140D and 141A to 141D and the buried N-type highly-doped regions 170.

Of the eight horizontal magnetic field detection N-type doped regions 120A to 120D and 121A to 121D, the four horizontal magnetic field detection N-type doped regions 121A, 121B, 121C, and 121D, which are formed on right and left sides of the surface N-type highly-doped regions 130A, 130B, 130C, and 130D (X direction), are configured to detect X direction components of horizontal magnetic field components, whereas the four horizontal magnetic field detection N-type doped regions 120A, 120B, 120C, and 120D, which are formed on upper and lower sides of the surface N-type highly-doped regions 130A, 130B, 130C, and 130D (Y direction), are configured to detect Y direction components of the horizontal magnetic field components.

In addition, the Hall element includes surface P-type highly-doped regions 160 and 161 formed so as to surround the vertical magnetic field detection N-type doped region 110 and the horizontal magnetic field detection N-type doped regions 120A, 120B, 120C, 120D, 121A, 121B, 121C, and 121D. The surface P-type highly-doped regions 160 and 161 serve as potential barrier portions for forming partitions between the vertical magnetic field sensing portion and the horizontal magnetic field sensing portion. Further, the outer-peripheral surface P-type highly-doped region 161 serves as an element isolation portion for isolating the Hall element from other elements.

Next, a method of manufacturing the Hall element 10 is described.

First, on the P-type semiconductor substrate layer 100, the vertical magnetic field detection N-type doped region 110, and an N-type doped layer that is to serve as the horizontal magnetic field detection N-type doped regions 120A to 120D and 121A to 121D are formed. It is desired that this N-type doped layer be an epitaxial layer. It is preferred that, before forming an epitaxial layer, buried N-type highly-doped regions be formed in a layer under the horizontal magnetic field detection N-type doped regions 120A to 120D and 121A to 121D (Z direction). However, instead of forming the epitaxial layer, a deep N well may be used for forming the vertical magnetic field detection N-type doped region 110, and the N-type doped regions that are to serve as the horizontal magnetic field detection N-type doped regions 120A to 120D and 121A to 121D.

Next, the surface P-type highly-doped regions 160 and 161 are formed. In order to serve as the potential barrier portions for forming the partitions between the vertical magnetic field sensing portion and the horizontal magnetic field sensing portion, the surface P-type highly-doped regions 160 and 161 need to be formed deep. Thus, the surface P-type highly-doped regions 160 and 161 are formed with the use of a P well or high-energy ion implantation.

Then, the surface N-type highly-doped regions 130A, 130B, 130C, and 130D, the surface N-type highly-doped regions 140A, 140B, 1400, 140D, 141A, 141B, 141C, and 141D, and the surface N-type highly-doped regions 150 are formed as the vertical magnetic field detection control current input terminals, the horizontal magnetic field detection control current input terminals, and the horizontal magnetic field Hall voltage output terminals corresponding to the vertical magnetic field detection N-type doped region 110, respectively. In this case, it is desired that the vertical magnetic field detection surface N-type highly-doped regions 130A, 130B, 130C, and 130D serving as the vertical magnetic field detection control current input terminals and the horizontal magnetic field Hall voltage output terminals be formed deep, the horizontal magnetic field detection surface N-type highly-doped regions 140A, 140B, 140C, 140D, 141A, 141B, 141C, and 141D serving as the horizontal magnetic field detection control current input terminals be formed shallow, and the surface N-type highly-doped regions 150 serving as the horizontal magnetic field Hall voltage output terminals be formed deeper than the surface N-type highly-doped regions serving as the horizontal magnetic field detection control current input terminals. Thus, those surface N-type highly-doped regions that are to serve as electrodes are formed through separate steps.

Now, operations of detecting vertical magnetic fields and horizontal magnetic fields and removing offset voltage by the Hall element 10 in the above-mentioned embodiment are described.

First, positive voltage is applied to the vertical magnetic field detection control current input terminal 130A that is an N-type highly-doped region of the Hall element 10 of FIG. 1 and the horizontal magnetic field detection control current input terminals 1400 and 141C, and the vertical magnetic field detection control current input terminal 130C that is an N-type highly-doped region and the horizontal magnetic field detection control current input terminals 140A and 141A are grounded. At this time, in the vertical magnetic field detection N-type doped region 110, current is caused to flow from the vertical magnetic field detection control current input terminal 130A to the vertical magnetic field detection control current input terminal 130C. When a vertical magnetic field is received, a vertical magnetic field Hall voltage VHZA is generated between the vertical magnetic field detection control current input terminals 130B and 130D.

Further, in the horizontal magnetic field detection N-type doped region 121A, current is caused to flow from the vertical magnetic field detection control current input terminal 130A to the horizontal magnetic field detection control current input terminal 141A via the buried N-type highly-doped region 170. When an X direction horizontal magnetic field is received, an X direction horizontal magnetic field Hall voltage VHXA is generated between the two horizontal magnetic field detection Hall voltage output terminals 150 in the horizontal magnetic field detection N-type doped region 121A.

In addition, in the horizontal magnetic field detection N-type doped region 121C, current is caused to flow from the horizontal magnetic field detection control current input terminal 141C to the vertical magnetic field detection control current input terminal 130C via the buried N-type highly-doped region 170. When an X direction horizontal magnetic field is received, an X direction horizontal magnetic field Hall voltage VHXC in a direction reverse to VHXA is generated between the two horizontal magnetic field detection Hall voltage output terminals 150 in the horizontal magnetic field detection N-type doped region 121C.

Further, in the horizontal magnetic field detection N-type doped region 120A, current is caused to flow from the vertical magnetic field detection control current input terminal 130A to the horizontal magnetic field detection control current input terminal 140A via the buried N-type highly-doped region 170. When a Y direction horizontal magnetic field is received, a Y direction horizontal magnetic field Hall voltage VHYA is generated between the two horizontal magnetic field detection Hall voltage output terminals 150 in the horizontal magnetic field detection N-type doped region 120A.

In addition, in the horizontal magnetic field detection N-type doped region 120C, current is caused to flow from the horizontal magnetic field detection control current input terminal 140C to the vertical magnetic field detection control current input terminal 130C via the buried N-type highly-doped region 170. When a Y direction horizontal magnetic field is received, a Y direction horizontal magnetic field Hall voltage VHYC in a direction reverse to VHYA is generated between the two horizontal magnetic field detection Hall voltage output terminals 150 in the horizontal magnetic field detection N-type doped region 120C.

Next, positive voltage is applied to the vertical magnetic field detection control current input terminal 130B that is an N-type highly-doped region and the horizontal magnetic field detection control current input terminals 140B and 141B, and the vertical magnetic field detection control current input terminal 130D that is an N-type highly-doped region and the horizontal magnetic field detection control current input terminals 140D and 141D are grounded. At this time, in the vertical magnetic field detection N-type doped region 110, current is caused to flow from the vertical magnetic field detection control current input terminal 130B to the vertical magnetic field detection control current input terminal 130D. When a vertical magnetic field is received, a vertical magnetic field Hall voltage VHZB is generated between the vertical magnetic field detection control current input terminals 130A and 130C.

Further, in the horizontal magnetic field detection N-type doped region 121B, current is caused to flow from the vertical magnetic field detection control current input terminal 130B to the horizontal magnetic field detection control current input terminal 141B via the buried N-type highly-doped region 170. When an X direction horizontal magnetic field is received, an X direction horizontal magnetic field Hall voltage VHXB is generated between the two horizontal magnetic field detection Hall voltage output terminals 150 in the horizontal magnetic field detection N-type doped region 121B.

In addition, in the horizontal magnetic field detection N-type doped region 121D, current is caused to flow from the horizontal magnetic field detection control current input terminal 141D to the vertical magnetic field detection control current input terminal 130D via the buried N-type highly-doped region 170. When an X direction horizontal magnetic field is received, an X direction horizontal magnetic field Hall voltage VHXD in a direction reverse to VHXB is generated between the two horizontal magnetic field detection Hall voltage output terminals 150 in the horizontal magnetic field detection N-type doped region 121D.

Further, in the horizontal magnetic field detection N-type doped region 120B, current is caused to flow from the vertical magnetic field detection control current input terminal 130B to the horizontal magnetic field detection control current input terminal 140B via the buried N-type highly-doped region 170. When a Y direction horizontal magnetic field is received, a Y direction horizontal magnetic field Hall voltage VHYB is generated between the two horizontal magnetic field detection Hall voltage output terminals 150 in the horizontal magnetic field detection N-type doped region 120B.

In addition, in the horizontal magnetic field detection N-type doped region 120D, current is caused to flow from the horizontal magnetic field detection control current input terminal 140D to the vertical magnetic field detection control current input terminal 130D via the buried N-type highly-doped region 170. When a Y direction horizontal magnetic field is received, a Y direction horizontal magnetic field Hall voltage VHYD in a direction reverse to VHYB is generated between the two horizontal magnetic field detection Hall voltage output terminals 150 in the horizontal magnetic field detection N-type doped region 120D.

Through the operations described above, the vertical magnetic field detection Hall voltages VHZA and VHZB due to vertical magnetic fields are obtained. Each of the vertical magnetic field detection Hall voltages includes offset voltage, that is, is a voltage of Hall voltage and offset voltage added together. Thus, VHZA and VHZB can be expressed as Vhz+Vos and −Vhz+Vos, respectively. One of the two outputs is subtracted from another to obtain (VHZA−VHZB)/2=Vhz, thereby being capable of removing an offset voltage of a vertical magnetic field component detection Hall voltage. In short, an offset voltage of a vertical magnetic field component detection Hall voltage can be removed with spinning current.

Meanwhile, X direction horizontal magnetic field detection Hall voltages VHXA, VHXB, VHXC and VHXD due to X direction horizontal magnetic fields are obtained. Each of the horizontal magnetic field detection Hall voltages includes offset voltage, that is, is a voltage of Hall voltage and offset voltage added together. Thus, VHXA, VHXC, VHXB, and VHXD can be expressed as Vhx+Vos, −Vhx+Vos, Vhx+Vos, and −Vhx+Vos, respectively. The four outputs are calculated to obtain (VHXA−VHXC+VHXB−VHXD)/4=Vhx, thereby being capable of removing an offset voltage of an X direction horizontal magnetic field component detection Hall voltage.

Further, Y direction horizontal magnetic field detection Hall voltages VHYA, VHYB, VHYC and VHYD due to Y direction horizontal magnetic fields are obtained. Each of the horizontal magnetic field detection Hall voltages includes offset voltage, that is, is a voltage of Hall voltage and offset voltage added together. Thus, VHYA, VHYC, VHYB, and VHYD can be expressed as Vhy+Vos, −Vhy+Vos, Vhy+Vos, and −Vhy+Vos, respectively. The four outputs are calculated to obtain (VHYA−VHYC+VHYB−VHYD)/4=Vhy, thereby being capable of removing an offset voltage of a Y direction horizontal magnetic field component detection Hall voltage.

In short, in horizontal magnetic field detection portions including the horizontal magnetic field detection N-type doped regions and the vertical magnetic field detection surface N-type highly-doped regions, four outputs of respective magnetic field detection Hall voltages of the X direction and Y direction magnetic field portions are calculated, thereby being capable of removing an offset voltage of a horizontal magnetic field component detection Hall voltage.

As described above, the vertical magnetic field detection surface N-type highly-doped regions 130A to 130D function also as the horizontal magnetic field detection control current input terminals, and thus simultaneously cause current to flow in directions that enable X, Y, and Z direction magnetic field detection in such a manner that a plurality of currents flow in the same direction. Consequently, it is possible to simultaneously perform removal of an offset voltage of a vertical magnetic field component detection Hall voltage with spinning current in the vertical magnetic field detection, and removal of an offset voltage of a horizontal magnetic field component detection Hall voltage in the horizontal magnetic field detection portions by calculating four outputs of respective magnetic field detection Hall voltages of the X direction and Y direction magnetic field portions. It is therefore possible to simultaneously realize vertical magnetic field detection and horizontal magnetic field detection in both of which offset voltage is removed.

Further, a voltage application method is not limited to the example in the embodiment described above.

A vertical magnetic field detection control voltage is applied to the opposite vertical magnetic field detection control current input terminals, and a vertical magnetic field detection Hall voltage is detected by the opposite vertical magnetic field detection control current input terminals opposed thereto. At this time, a voltage reverse to the applied vertical magnetic field detection control voltage is applied to the horizontal magnetic field detection control current input terminals around the vertical magnetic field detection control current input terminals applied with the vertical magnetic field detection control voltage so that current flows through the horizontal magnetic field detection N-type doped regions. With this, X direction and Y direction magnetic field detection Hall voltages are detected by the horizontal magnetic field detection Hall voltage output terminals 150.

Next, the vertical magnetic field detection control current input terminals that have detected the vertical magnetic field detection Hall voltage and the vertical magnetic field detection control current input terminals that have been applied with the vertical magnetic field detection control voltage are switched, and voltage is similarly applied. Also in this manner, it is possible to simultaneously perform removal of an offset voltage of a vertical magnetic field component detection Hall voltage with spinning current in the vertical magnetic field detection, and removal of an offset voltage of a horizontal magnetic field component detection Hall voltage in the horizontal magnetic field detection portions by calculating four outputs of respective magnetic field detection Hall voltages of the X direction and Y direction magnetic field portions.

Figure 4:
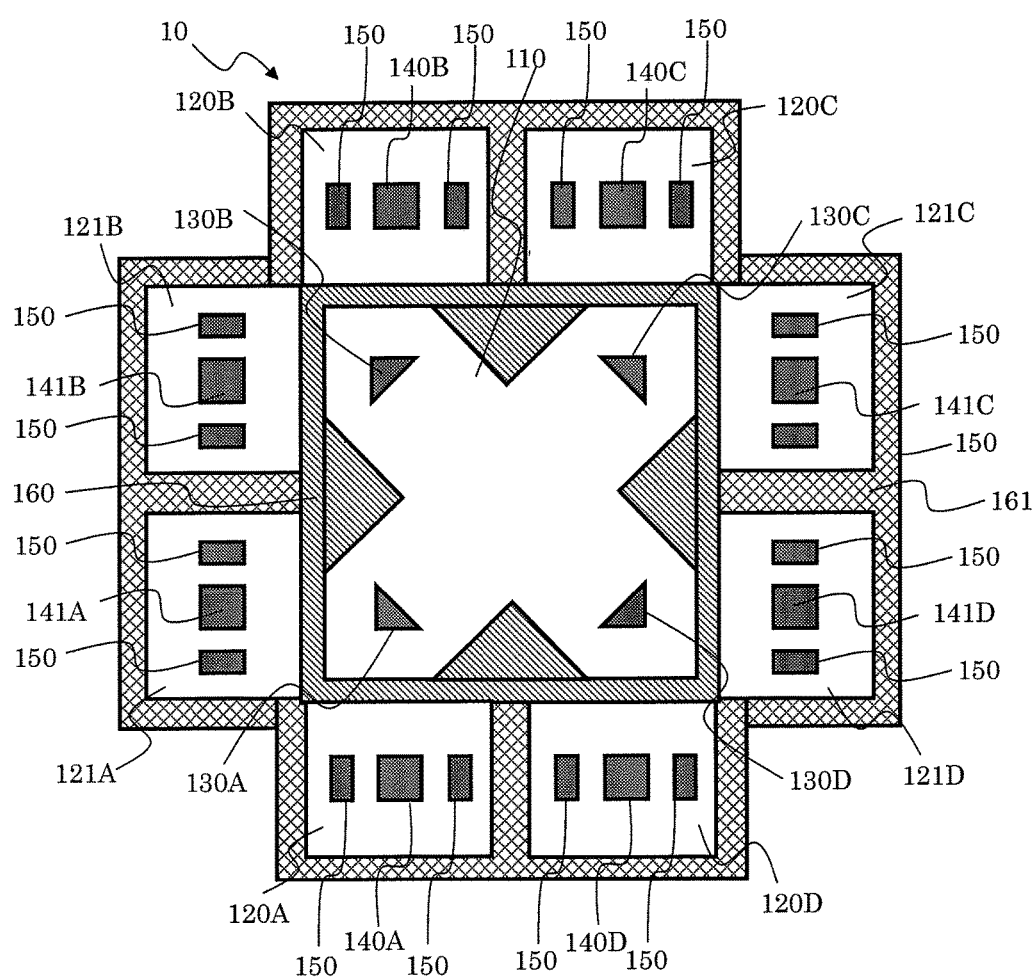
FIG. 4 is a plan view of a Hall element according to another embodiment of the present invention.
Figure 5:
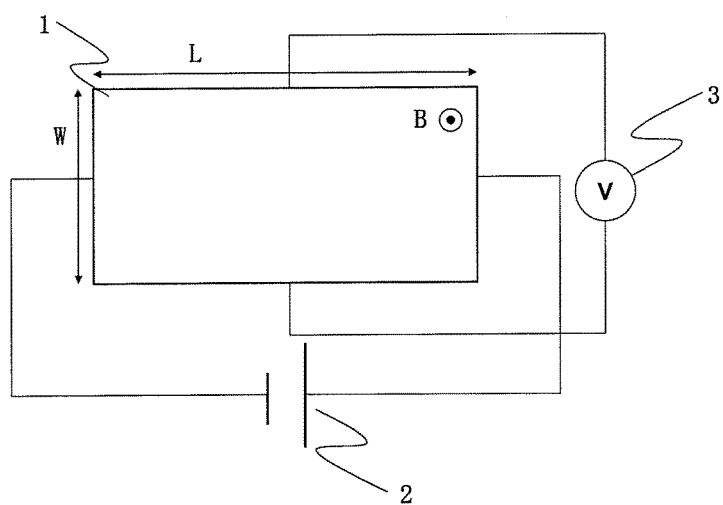
FIG. 5 is a diagram for illustrating the principle of an ideal Hall effect.
Figure 6:
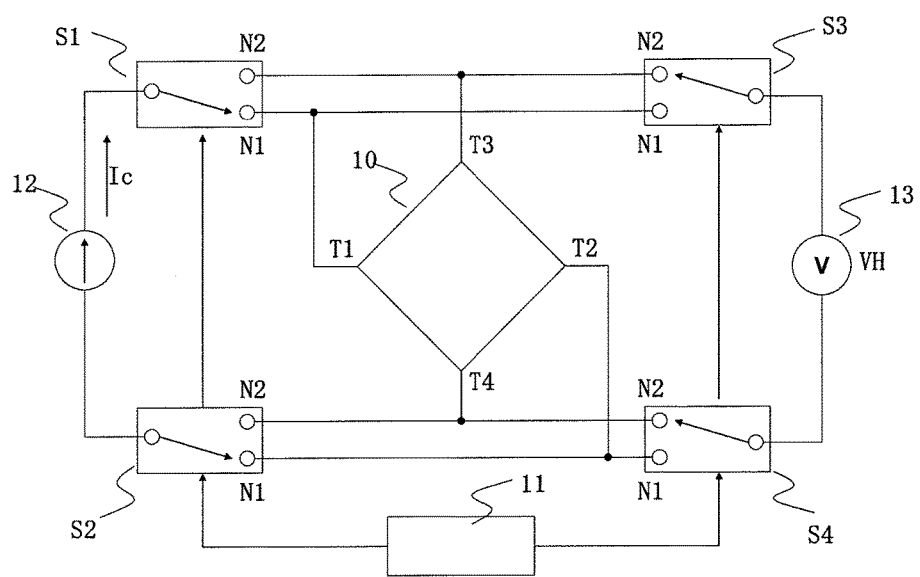
FIG. 6 is a diagram for illustrating a method of removing offset voltage with spinning current.

FIG. 4 is a plan view for illustrating a Hall element according to another embodiment of the present invention. The vertical magnetic field detection N-type doped region 110 is not limited to the square one illustrated in FIG. 1, and may be a vertical magnetic field detection N-type doped region having a four-fold rotational axis that includes, for example, a cross-shaped magnetism sensing portion and, at four end portions of the magnetism sensing portion, Hall current control electrodes and Hall voltage output terminals corresponding to the surface N-type highly-doped regions 130A, 130B, 130C, and 130D, as illustrated in FIG. 4.

The shape of the vertical magnetic field detection N-type doped region 110 is a cross shape (or can also be called "X shape"). A Hall voltage in the vicinity of the center can be efficiently measured with a cross-shaped (or X-shaped) vertical magnetic field detection N-type doped region 110.

What is claimed is:

1. A Hall element configured to detect a vertical magnetic field and a horizontal magnetic field by utilizing a Hall effect, to thereby reduce offset voltage, the Hall element comprising:
    a P-type semiconductor substrate layer formed of P-type silicon;
    a vertical magnetic field detection N-type doped region formed on the P-type semiconductor substrate layer; and
    eight horizontal magnetic field detection N-type doped regions formed so as to surround the vertical magnetic field detection N-type doped region,
    wherein the vertical magnetic field detection N-type doped region comprises:
    a vertical magnetic field sensing portion having a four-fold rotational axis and one of a square shape and a cross shape; and
    first surface N-type highly-doped regions having the same shape formed at one of respective vertices and end portions of the vertical magnetic field sensing portion, each of the first surface N-type highly-doped regions being configured to serve as a vertical magnetic field detection control current input terminal and a vertical magnetic field Hall voltage output terminal.

2. A Hall element according to claim 1, wherein the eight horizontal magnetic field detection N-type doped regions comprise:
    four horizontal magnetic field detection N-type doped regions that are formed on right and left sides of the vertical magnetic field detection N-type doped region (X direction), and are configured to detect an X direction component of horizontal magnetic field components; and
    four horizontal magnetic field detection N-type doped regions that are formed on upper and lower sides of the vertical magnetic field detection N-type doped region (Y direction), and are configured to detect a Y direction component of the horizontal magnetic field components.

3. A Hall element according to claim 2,
    wherein the eight horizontal magnetic field detection N-type doped regions and the first surface N-type highly-doped regions form horizontal magnetic field detection portions, and
    wherein calculation of four outputs of respective magnetic field detection Hall voltages of X direction magnetic field portions and Y direction magnetic field portions in the horizontal magnetic field detection portions allows removal of an offset voltage of a horizontal magnetic field component detection Hall voltage.

4. A Hall element according to claim 3, further configured to simultaneously perform vertical magnetic field detection and horizontal magnetic field detection in both of which offset voltage is removed by simultaneously performing:
    the removal of the offset voltage of the vertical magnetic field component detection Hall voltage with spinning current in the vertical magnetic field detection N-type doped region; and
    the removal of the offset voltage of the horizontal magnetic field component detection Hall voltage in the horizontal magnetic field detection portions by calculating the four outputs of the respective magnetic field detection Hall voltages of the X direction magnetic field portions and the Y direction magnetic field portions.

5. A Hall element according to claim 1,
    wherein all of the eight horizontal magnetic field detection N-type doped regions have the same shape, and
    wherein the Hall element further comprises, for the each of the first surface N-type highly-doped regions:
    horizontal direction magnetic field detection control current input terminals that are formed on a right and left (X) direction axis and an up and down (Y) direction axis of the Hall element, and comprise second surface N-type highly-doped regions;

a buried N-type highly-doped region formed in the P-type semiconductor substrate layer corresponding to lower parts of the horizontal direction magnetic field detection control current input terminals in a substrate direction (Z direction);

a horizontal magnetic field sensing portion sandwiched between the each of the horizontal direction magnetic field detection control current input terminals and the buried N-type highly-doped region; and horizontal magnetic field Hall voltage output terminals that are formed in the vertical (Y) direction and the horizontal (X) direction so as to sandwich the each of the horizontal direction magnetic field detection control current input terminals, and comprise two third surface N-type highly-doped regions.

6. A Hall element according to claim 5, wherein the each of the first surface N-type highly-doped regions is configured to function also as the each of the horizontal direction magnetic field detection control current input terminals.

7. A Hall element according to claim 5, wherein the first surface N-type highly-doped regions and the two third surface N-type highly-doped regions are formed deeper than the second surface N-type highly-doped regions.

8. A Hall element according to claim 1, further comprising surface P-type highly-doped regions surrounding the vertical magnetic field detection N-type doped region and the eight horizontal magnetic field detection N-type doped regions.

9. A Hall element according to claim 8, wherein each of the surface P-type highly-doped regions comprises a potential barrier portion forming a partition between the vertical magnetic field sensing portion and the horizontal magnetic field sensing portion.

10. A Hall element according to claim 8, wherein, of the surface P-type highly-doped regions, an outer peripheral surface P-type highly-doped region comprises an element isolation portion for isolating the Hall element from other elements.

11. A Hall element according to claim 1, wherein spinning current in the vertical magnetic field detection N-type doped region allows removal of an offset voltage of a vertical magnetic field component detection Hall voltage.

* * * * *